(12) United States Patent
Romero et al.

(10) Patent No.: US 10,217,646 B2
(45) Date of Patent: Feb. 26, 2019

(54) TRANSITION METAL DRY ETCH BY ATOMIC LAYER REMOVAL OF OXIDE LAYERS FOR DEVICE FABRICATION

(71) Applicant: Intel Corporation, Santa Clara, CA (US)

(72) Inventors: Patricio E. Romero, Portland, OR (US); John J. Plombon, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/570,968

(22) PCT Filed: Jun. 17, 2015

(86) PCT No.: PCT/US2015/036302
§ 371 (c)(1),
(2) Date: Oct. 31, 2017

(87) PCT Pub. No.: WO2016/204757
PCT Pub. Date: Dec. 22, 2016

(65) Prior Publication Data
US 2018/0138054 A1 May 17, 2018

(51) Int. Cl.
*H01L 21/3213* (2006.01)
*H01L 21/768* (2006.01)
(Continued)

(52) U.S. Cl.
CPC .. *H01L 21/32135* (2013.01); *H01L 21/28079* (2013.01); *H01L 21/76802* (2013.01);
(Continued)

(58) Field of Classification Search
CPC ............. H01L 21/32135; H01L 23/528; H01L 21/76802; H01L 43/12; H01L 23/53209;
(Continued)

(56) References Cited

U.S. PATENT DOCUMENTS 5,200,032 A 4/1993 Shinohara
8,124,541 B2 * 2/2012 Marsh ............... H01L 21/32135
216/58
(Continued)

OTHER PUBLICATIONS

International Search Report and Written Opinion for International Patent Application No. PCT/US2015/036302 dated Feb. 26, 2016, 10 pgs.
(Continued)

*Primary Examiner* — Syed Gheyas
(74) *Attorney, Agent, or Firm* — Schwabe, Williamson & Wyatt, P.C.

(57) ABSTRACT

Transition metal dry etch by atomic layer removal of oxide layers for device fabrication, and the resulting devices, are described. In an example, a method of etching a film includes reacting a surface layer of a transition metal species of a transition metal-containing film with a molecular oxidant species. The method also includes removing volatile fragments of the reacted molecular oxidant species to provide an oxidized surface layer of the transition metal species. The method also includes reacting the oxidized surface layer of the transition metal species with a molecular etchant. The method also includes removing the reacted oxidized surface layer of the transition metal species and the reacted molecular etchant by volatlilization.

21 Claims, 8 Drawing Sheets

(51) Int. Cl.
  *H01L 23/522* (2006.01)
  *H01L 23/532* (2006.01)
  *H01L 43/12* (2006.01)
  *H01L 21/28* (2006.01)
  *H01L 23/528* (2006.01)
  *H01L 27/22* (2006.01)
  *H01L 43/02* (2006.01)
  *H01L 43/08* (2006.01)

(52) U.S. Cl.
  CPC .. *H01L 21/76834* (2013.01); *H01L 21/76883* (2013.01); *H01L 23/528* (2013.01); *H01L 23/5226* (2013.01); *H01L 23/53209* (2013.01); *H01L 43/12* (2013.01); *H01L 27/222* (2013.01); *H01L 43/02* (2013.01); *H01L 43/08* (2013.01)

(58) Field of Classification Search
  CPC ......... H01L 21/28079; H01L 21/76883; H01L 23/5226; H01L 21/76834; H01L 43/08; H01L 27/222; H01L 43/00
  See application file for complete search history.

(56) References Cited

U.S. PATENT DOCUMENTS

| | | | |
|---|---|---|---|
| 2004/0113279 A1* | 6/2004 | Chen | H01L 21/76834 257/774 |
| 2005/0224456 A1 | 10/2005 | Chen et al. | |
| 2009/0042384 A1* | 2/2009 | Miyoshi | H01L 21/02063 438/627 |
| 2011/0065276 A1 | 3/2011 | Ganguly et al. | |
| 2012/0180811 A1 | 7/2012 | Gunji et al. | |
| 2015/0118848 A1 | 4/2015 | Draeger et al. | |

OTHER PUBLICATIONS

International Preliminary Report on Patentability for International Patent Application No. PCT/US2015/036302, dated Dec. 28, 2017, 7 pages.

* cited by examiner

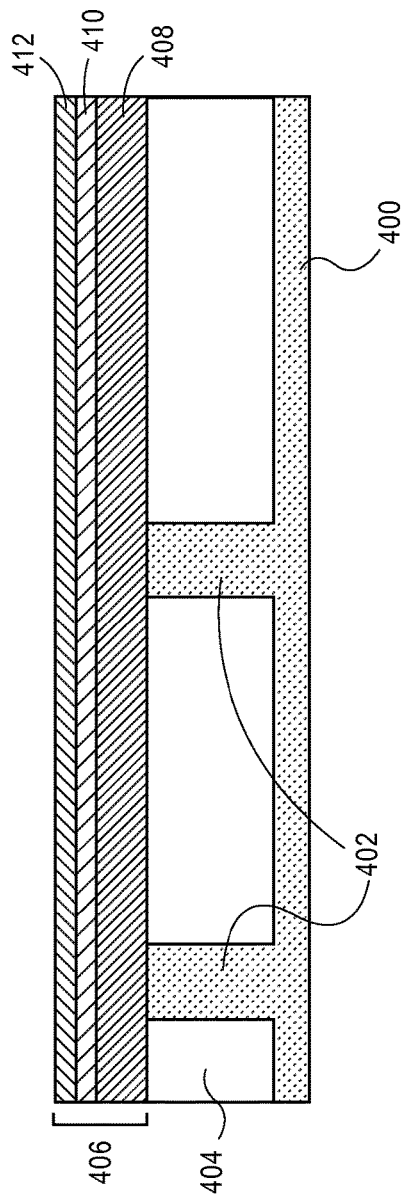
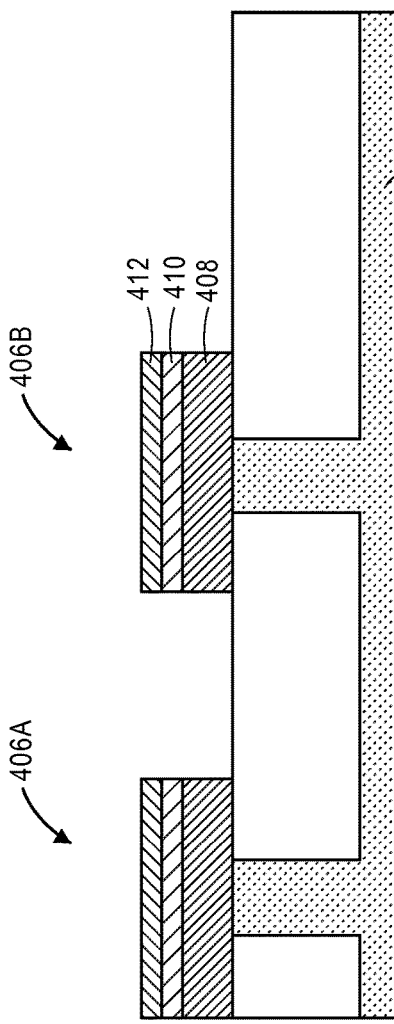
FIG. 4
FIG. 5

TRANSITION METAL DRY ETCH BY ATOMIC LAYER REMOVAL OF OXIDE LAYERS FOR DEVICE FABRICATION

CROSS-REFERENCE TO RELATED APPLICATION

This patent application is a U.S. National Phase Application under 35 U.S.C. § 371 of International Application No. PCT/US2015/036302, filed Jun. 17, 2015, entitled "TRANSITION METAL DRY ETCH BY ATOMIC LAYER REMOVAL OF OXIDE LAYERS FOR DEVICE FABRICATION," which designates the United States of America, the entire disclosure of which is hereby incorporated by reference in its entirety and for all purposes.

TECHNICAL FIELD

Embodiments of the invention are in the field of semiconductor structures and processing and, in particular, transition metal dry etch by atomic layer removal of oxide layers for device fabrication, and the resulting devices.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips.

In a first aspect, integrated circuits commonly include electrically conductive microelectronic structures, which are known in the arts as vias, to electrically connect metal lines or other interconnects above the vias to metal lines or other interconnects below the vias. Vias are typically formed by a lithographic process. Representatively, a photoresist layer may be spin coated over a dielectric layer, the photoresist layer may be exposed to patterned actinic radiation through a patterned mask, and then the exposed layer may be developed in order to form an opening in the photoresist layer. Next, an opening for the via may be etched in the dielectric layer by using the opening in the photoresist layer as an etch mask. This opening is referred to as a via opening. Finally, the via opening may be filled with one or more metals or other conductive materials to form the via.

In the past, the sizes and the spacing of vias has progressively decreased, and it is expected that in the future the sizes and the spacing of the vias will continue to progressively decrease, for at least some types of integrated circuits (e.g., advanced microprocessors, chipset components, graphics chips, etc.). One measure of the size of the vias is the critical dimension of the via opening. One measure of the spacing of the vias is the via pitch. Via pitch represents the center-to-center distance between the closest adjacent vias. When patterning extremely small vias with extremely small pitches by such lithographic processes, several challenges present themselves, especially when the pitches are around 70 nanometers (nm) or less and/or when the critical dimensions of the via openings are around 35 nm or less.

One such challenge is that the overlay between the vias and the overlying interconnects, and the overlay between the vias and the underlying landing interconnects, generally need to be controlled to high tolerances on the order of a quarter of the via pitch. As via pitches scale ever smaller over time, the overlay tolerances tend to scale with them at an even greater rate than lithographic equipment is able to keep up. Another such challenge is that the critical dimensions of the via openings generally tend to scale faster than the resolution capabilities of the lithographic scanners. Shrink technologies exist to shrink the critical dimensions of the via openings. However, the shrink amount tends to be limited by the minimum via pitch, as well as by the ability of the shrink process to be sufficiently optical proximity correction (OPC) neutral, and to not significantly compromise line width roughness (LWR) and/or critical dimension uniformity (CDU). Yet another such challenge is that the LWR and/or CDU characteristics of photoresists generally need to improve as the critical dimensions of the via openings decrease in order to maintain the same overall fraction of the critical dimension budget. However, currently the LWR and/or CDU characteristics of most photoresists are not improving as rapidly as the critical dimensions of the via openings are decreasing. A further such challenge is that the extremely small via pitches generally tend to be below the resolution capabilities of even extreme ultraviolet (EUV) lithographic scanners. As a result, commonly two, three, or more different lithographic masks may be used, which tend to increase the costs. At some point, if pitches continue to decrease, it may not be possible, even with multiple masks, to print via openings for these extremely small pitches using EUV scanners. Furthermore, metal fill of such openings can be even more problematic.

Thus, improvements are needed in the area of via and related interconnect manufacturing technologies.

In a second aspect, multi-gate transistors, such as tri-gate transistors, have become more prevalent as device dimensions continue to scale down. In conventional processes, tri-gate or other non-planar transistors are generally fabricated on either bulk silicon substrates or silicon-on-insulator substrates. In some instances, bulk silicon substrates are preferred due to their lower cost and compatibility with the existing high-yielding bulk silicon substrate infrastructure. Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

Thus, improvements are needed in the area of non-planar transistor manufacturing technologies.

BRIEF DESCRIPTION OF THE DRAWINGS

FIGS. 4 and 5 illustrate various operations in a processing scheme using a transition metal dry etch approach for MRAM stack patterning, in accordance with an embodiment of the present invention.

DESCRIPTION OF THE EMBODIMENTS

Figure 1:
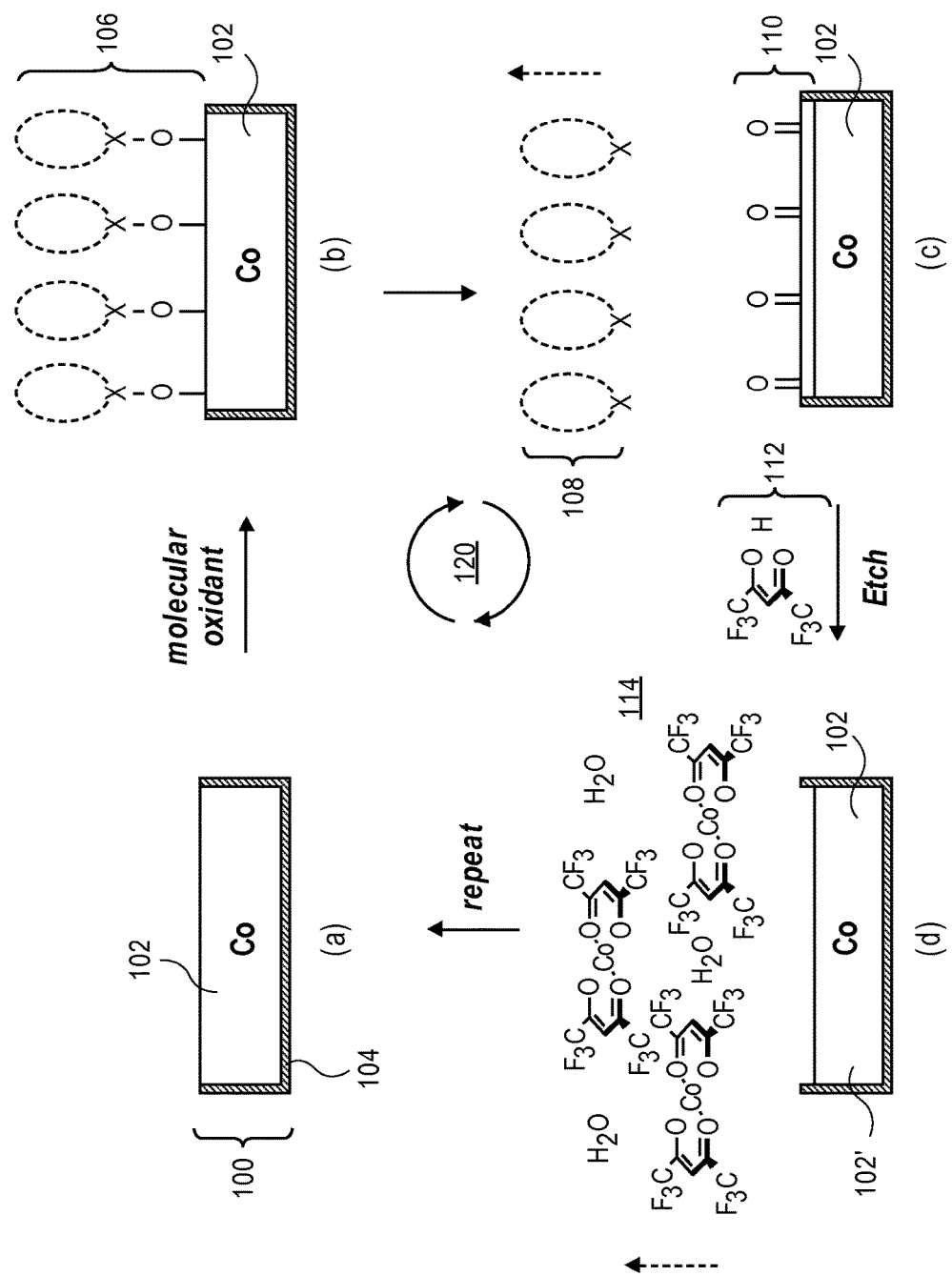
FIG. 1 illustrates operations in an atomic level etching scheme of a cobalt layer, in accordance with an embodiment of the present invention.

Transition metal dry etch by atomic layer removal of oxide layers for device fabrication, and the resulting devices, are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to transition metal dry etch approaches utilizing atomic layer removal of oxide layers. Such atomic layer etching may be implemented for e.g., cobalt dry etching, and may be applicable for, e.g., interconnect technologies, non-copper interconnect technologies, random access magnetic memory, etc. Exemplary embodiments described in greater detail include, but are not limited to, generic bulk layer etching, back end non-copper recessing, magnetic memory stack patterning with traditionally non-etchable layers, and front end metal gate applications.

Embodiments described herein may be implemented to provide an approach for removing non-volatile transition metals in traditionally patterned features, for removing layers of non-volatile magnetic random access memory devices (MRAM), and for narrow interconnect vias. There is currently no known efficient, manufacturable process for etching and cleaning such materials. However, as transition metal containing layers become increasingly prevalent with each advancing technology node, a need for effective etching of such material layers becomes increasingly important.

To provide context, the patterning by dry etching of semiconductor architectures containing late transition metal elements (e.g., Co, Ru, Pt, Fe) is currently a very challenging problem. State of the art approaches such as etching using high energy sputtering result in significant sidewall re-deposition (leading to high levels of contamination) due to the absence of a mechanism to cleanly volatilize and eliminate the removed fragments. Meanwhile, wet etch schemes are for the most part isotropic and suffer from significant undercut in patterned features.

Addressing such issues, one or more embodiments described herein involves a new approach for thermal removal/cleaning of layers including such transition metals. Not to be bound by theory, it is understood that such approaches may involve a surface chemical oxidation followed by complexation with an organic ligand to produce volatile species. The species generated by such a process are thermally stable and may be cleanly vaporized at a temperature far below typical annealing temperatures (e.g., less than approximately 250 degrees Celsius).

To provide further context, the reaction of semiconductor and metal surfaces with reactive halogen-containing molecules has traditionally been used as an etch method to remove volatile species. For instance, metallic aluminum can be readily and anisotropically etched with a chlorine plasma by forming volatile $Al_2C_{16}$. However, most transition metals of interest in future interconnects or MRAM applications (e.g., Co, Fe, Ni, Pt, Ru, etc.) form polymeric compounds of the form $\{MX_n\}_x$ (where M=metal, and X=a halogen), which are essentially non-volatile.

By contrast, embodiments described herein provide an alternative etch method based on removal of a chemically generated metal oxide, with the aid of an appropriate organic ligand. The result is an etchable transition metal species that can be etched in a controlled manner, with fragments driven off in the gas phase. Embodiments described herein may be viewed as providing an approach for removing transition metals in a clean and potentially quantitative manner, and with high selectivity to the metal itself.

With respect to implementations of the etching schemes described herein, it is to be appreciated that as traditional scaling continues, e.g., the shrinkage of critical dimensions below 14 nanometers, the need to control the manufacture of features at the sub-nanometer level becomes essential. Film stacks are now routinely approaching thicknesses of less than 2-3 nanometers in many applications, making necessary the adoption of atomic precise techniques such as atomic layer etching. Traditional plasma etch processes cannot meet the extreme selectivity requirements, making softer molecular chemistry-based techniques an attractive alternative. In particular, the efficient etch and removal of transition metals in semiconductor processing is becoming increasingly important as more of these elements are incorporated with every passing technology node. For instance, in the metallization of interconnects features at narrow critical dimension a proposed method of fabrication uses copper lines electrically connected with cobalt vias. In non-volatile magnetic memory devices based on tunneling magneto-resistance, data storage relies on Fe, Co and Ni and their corresponding alloys as the basic magnetic building blocks. However, the patterning by plasma etching of most of these metals poses a significant challenge due the lack of volatile species that can be accessed by chemical derivatization. As exemplified in the specific embodiments described below, an approach for transition metal etching involves thermal removal/cleaning of transition metals by surface chemical generation of a metal oxide, followed by complexation with a chelating organic ligand. The species generated by such processes are volatile, thermally stable and can be cleanly vaporized at low temperatures.

As an exemplary etching scheme, FIG. 1 illustrates operations in an atomic level etching scheme of a cobalt layer, in accordance with an embodiment of the present invention. Referring to part (a) of FIG. 1, a cobalt feature 100 includes a cobalt layer 102 housed in a layer 104, such as a dielectric or metal seed layer. Referring to part (b) of FIG. 1, a molecular oxidant 106 is reacted with the surface of the cobalt layer 102. Referring to part (c) of FIG. 1, volatile fragments 108 of the molecular oxidant 106 are removed or volatilized, leaving an oxidized surface layer 110 of the cobalt layer 102. Referring to part (d) of FIG. 1, a molecular etchant 112 is used to react with the oxidized surface layer 110 of the cobalt layer 102. The reaction forms a volatile species 114 which may be removed from the cobalt feature 100. In an example, the volatile species includes a cobalt complex having two bidentate ligands along with water, as is depicted in FIG. 1. The result as a recessed cobalt layer 102' that has been reduced in thickness by approximately one atomic cobalt layer. The cycle may then be repeated 120 to etch the cobalt layer to a target thickness.

Figure 2:
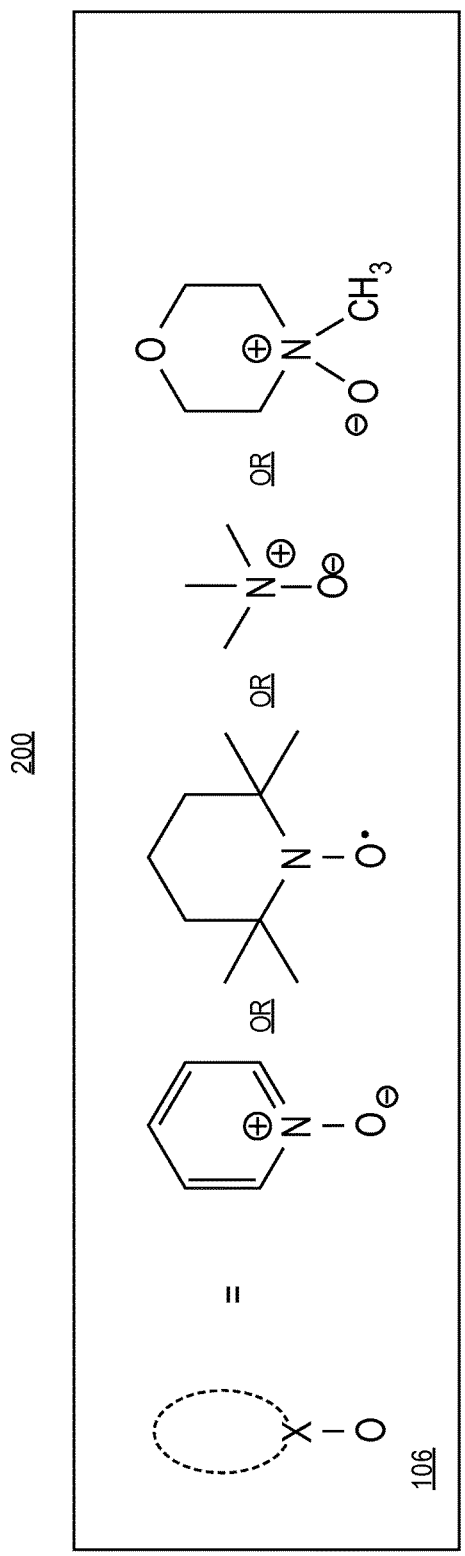
FIG. 2 is a Table of exemplary molecular oxidants suitable for use in the etching scheme of FIG. 1, in accordance with an embodiment of the present invention.

With reference again to FIG. 1, one or more embodiments described herein rely on surface functionalization of a metal (e.g., cobalt layer 102) to generate metal oxide layer (e.g., layer 110) using volatile molecular species containing reactive oxygen atoms. One or more of a variety of suitable species from the field of synthetic organic methodology may be used to accomplish clean oxidation of a metal feature on a substrate by "O" transfer from reactive nitrogen based skeletons. FIG. 2 is a Table 200 of exemplary molecular oxidants 106 suitable for use in the etching scheme of FIG. 1, in accordance with an embodiment of the present invention.

With reference again to FIG. 1, an etching approach may involve gaseous exposure of a metallic substrate or feature to accomplish self-limiting oxidation behavior similar to atomic layer deposition schemes. Following purge of excess reagent and reduced by-products, gas phase addition of a ligand such as hexafluoroacetylacetone (hfac; e.g., the exemplary molecular etchant 112 of FIG. 1) is implemented to form a discrete complex that may be thermally driven off, leading to clean removal of the metallic element. In some embodiments, water is also generated as a by-product 114, as is depicted in FIG. 1. In an embodiment, an advantage for using a molecular oxidant, over more traditional $O_2$ and oxygen plasma treatments, is the circumvention of undesired oxygen diffusion into the metal lattice. Such oxygen diffusion observed in conventional etching approaches otherwise leads to uncontrolled and gradient oxidation. The organic oxidation approach described herein ensures surface oxidative functionalization, eventually leading to the layer-by-layer controlled etch of oxide layer of the transition metal targeted for etching. The result enables conformal recess of patterned metal features.

Three exemplary implementations of atomic layer etching are described below as first, second and third aspects of embodiments of the present invention. It is to be appreciated that the three exemplary implementations are by no means limiting for possible applications of the atomic layer etching approaches described herein. Implementations may include, but are by no means limited to, advanced transistor architectures and MRAM devices. It is to be appreciated that residual carbon, nitrogen or fluorine may be present in finally fabricated vias and planar magnetic stacks as a signature of such etching that is detectable by TEM and/or XPS. It is also to be appreciated that a similar approach may be applicable to copper etching by using $O_2$ as the oxidant. However, in the copper case, oxidation is uncontrolled and does not allow for layer-by-layer controlled removal of the substrate. By contrast, the change in oxidant (e.g., molecular etchant 112) described herein enables on the atomic scale.

Figure 3:
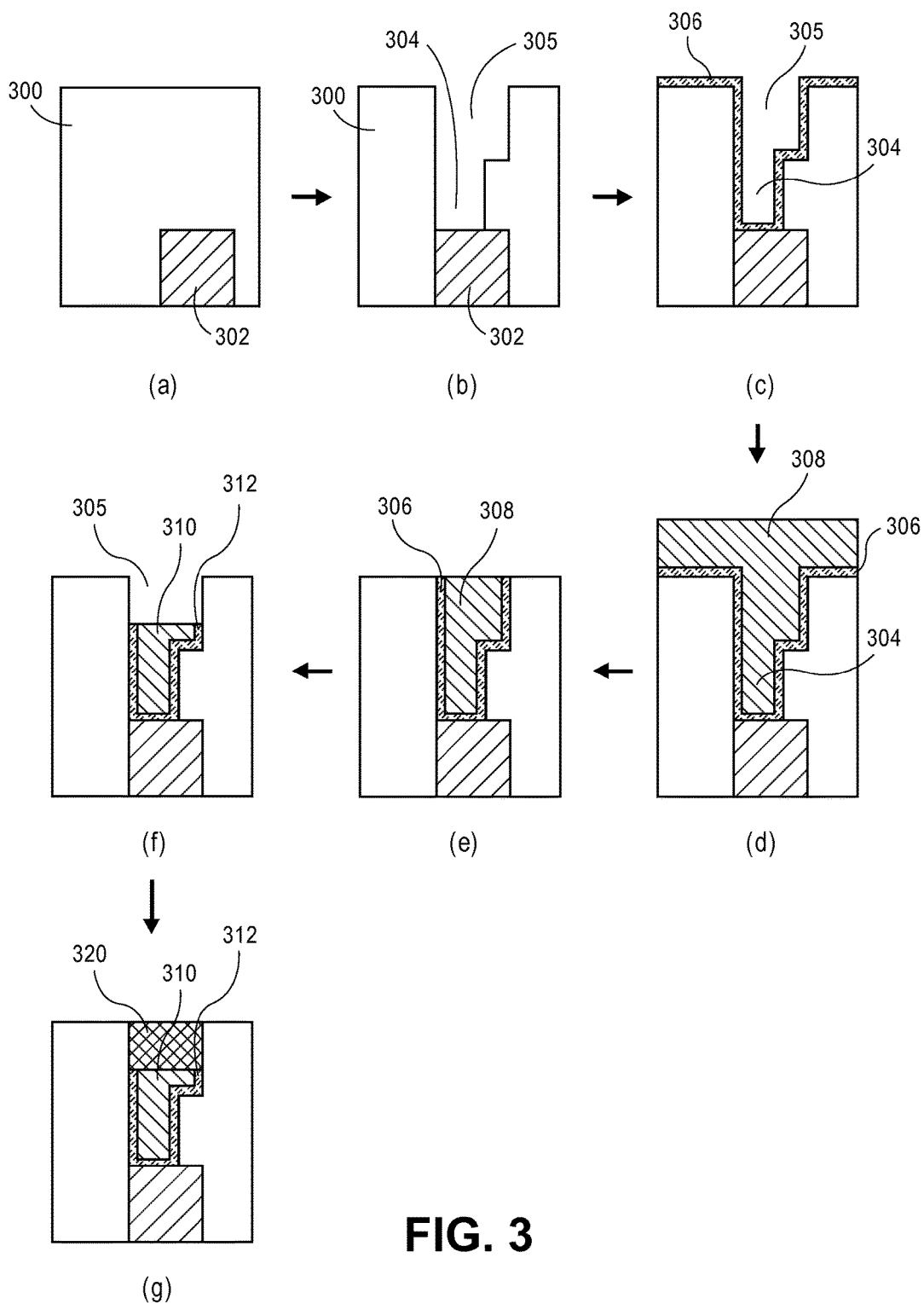
FIG. 3 illustrates various operations in a processing scheme using a transition metal dry etch approach for a dual damascene process, in accordance with an embodiment of the present invention.

In a first aspect of the present disclosure, embodiments are directed to non-copper interconnect recessing for, e.g., dielectric cap formation. FIG. 3 illustrates various operations in a processing scheme using a transition metal dry etch approach for a dual damascene process, in accordance with an embodiment of the present invention.

Referring to part (a) of FIG. 3, inter-layer dielectric (ILD) layer 300 deposition is performed on an underlying metallization structure that includes a metal line or other feature 302. A via and trench etch and breakthrough process is then performed to form a via opening 304 and a trench (metal line) opening 305 in the ILD layer 300 and to expose the metal line or other feature 302, as is depicted in part (b) of FIG. 3. Referring to part (c) of FIG. 3, a metal seed layer 306 is formed in the via opening 304 and in the trench opening 305. A metal fill layer 308 is then formed on the structure of part (c), as is depicted in part (d) of FIG. 3. The metal fill layer may include a transition metal species such as Co, Fe, Ni, Pt or Ru. Also, it is to be appreciated that the metal fill may be controlled to the level of the field, or the growth may be performed in excess and then planarized back (e.g., by a CMP process) during which seed layer 306 formed on the field may also be removed, as is depicted in part (e) of FIG. 3.

Referring to part (f) of FIG. 3, partial recess of the metal fill layer 308 is performed to provide recessed fill material layer 310. In an embodiment, the metal fill layer 308 is partially recessed using a transition metal dry etch approach as described in association with FIG. 1. In one such embodiment, the metal fill layer 308 is partially recessed selectively to the metal seed layer 306. However, in another embodiment the metal seed layer 306 is also etchable using techniques described herein. In that embodiment, the metal seed layer 306 is also partially recessed using a transition metal dry etch approach to form recessed metal seed layer 312, as is depicted in part (f) of FIG. 3. In either case, in one embodiment, as shown, the recessing is terminated within the trench opening 305, i.e., prior to exposure of the via opening 304.

Referring to part (g) of FIG. 3, a dielectric cap layer 320 is formed on the recessed metal fill layer 310 and on the recessed metal seed layer 312. Such a dielectric cap layer 320 may facilitate further processing and/or may be used to inhibit shoring between different conductive features. The resulting structure may represent a portion of a back end interconnect structure for a semiconductor device.

Although only one trench 304/305 is shown, in an embodiment, a starting structure for the implementation of FIG. 3 may be patterned in a grating-like pattern with trenches spaced at a constant pitch and having a constant width. The pattern, for example, may be fabricated by a pitch halving or pitch quartering approach. Some of the trenches may be associated with underlying vias or lower level metallization lines. For example, it is to be appreciated that the layers and materials described in association with FIG. 3 are typically formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structures depicted in FIG. 2A may be fabricated on underlying lower level interconnect layers. The resulting structure of part (g) of FIG. 3 may subsequently be used as a foundation for forming subsequent metal line/via and ILD layers. Alternatively, the structure of part (g) of FIG. 3 may represent the final metal interconnect layer in an integrated circuit.

Referring generally to FIG. 3, in an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts (e.g., those materials with a dielectric constant less than that of silicon dioxide), and combinations thereof. The interlayer dielectric material may be formed by conventional techniques, such as, for example, chemical vapor deposition (CVD), physical vapor deposition (PVD), or by other deposition methods. The interconnect lines (metal lines and vias structures) formed in the ILD material are also sometimes referred to in the art as traces, wires, lines, metal, or simply interconnect.

In a second aspect of the present disclosure, embodiments are directed to etching of material stacks for MRAM type devices. FIGS. 4 and 5 illustrate various operations in a processing scheme using a transition metal dry etch approach for MRAM stack patterning, in accordance with an embodiment of the present invention.

Referring to FIG. 4, a material stack 406 for forming magnetic tunnel junction (MTJ) includes a fixed magnetic layer 408, a tunnel oxide layer 410 and a free magnetic layer 412. The material stack 406 is formed above a plurality of load lines 402 formed above a bottom electrode 400 (which may be formed above a substrate, not shown; it is to be appreciated that although depicted as a common electrode for simplicity, it is to be understood that each device may be coupled to its own corresponding transistor electrode to form a 1T-1STTM cell). An inter-dielectric layer 404 may be included between load lines 402, as depicted in FIG. 4. Referring to FIG. 5, the material stack 406 is patterned (e.g., by lithography and etch processing) to provide individual MTJs 406A and 406B. In an embodiment, one or more of the layers of the material stack 406 is etched using a transition metal dry etch approach such as described in association with FIG. 1.

In an embodiment, the fixed magnetic layer 408 is composed of a material or stack of materials suitable for maintaining a fixed majority spin. Thus, the fixed magnetic layer 408 (or reference layer) may be referred to as a ferromagnetic layer. In one embodiment, the fixed magnetic layer 408 is composed of a single layer of cobalt iron boride (CoFeB). However, in another embodiment, the fixed magnetic layer 408 is composed of a cobalt iron boride (CoFeB) layer, ruthenium (Ru) layer, cobalt iron boride (CoFeB) layer stack. In a specific such embodiment, the fixed magnetic layer is in the form of a synthetic antiferromagnet (SAF). From a top down perspective, the stack is a CoFeB/Ru/CoFe stack (e.g., no boron in the bottom layer, but there may be in other embodiments). It is to be understood that Ru thickness is very specific, e.g., 8-9 Angstroms such that the coupling between the CoFeB and the CoFe is anti-ferromagnetic; they point in opposite directions.

Referring again to FIGS. 4 and 5, in an embodiment, the tunnel oxide layer 410 is composed of a material suitable for allowing current of a majority spin to pass through the layer, while impeding at least to some extent current of a minority spin to pass through the layer. Thus, tunnel oxide layer 410 (or spin filter layer) may be referred to as a tunneling layer. In one embodiment, tunnel oxide layer 410 is composed of a material such as, but not limited to, magnesium oxide (MgO) or aluminum oxide ($Al_2O_3$). In an embodiment, tunnel oxide layer 410 has a thickness of approximately 1 nanometer.

Referring again to FIGS. 4 and 5, in an embodiment, the free magnetic layer 412 is composed of a material suitable for transitioning between a majority spin and a minority spin, depending on the application. Thus, the free magnetic layer 412 (or memory layer) may be referred to as a ferromagnetic memory layer. In one embodiment, the free magnetic layer 412 is composed of a layer of cobalt iron (CoFe) or cobalt iron boride (CoFeB).

Figure 6:
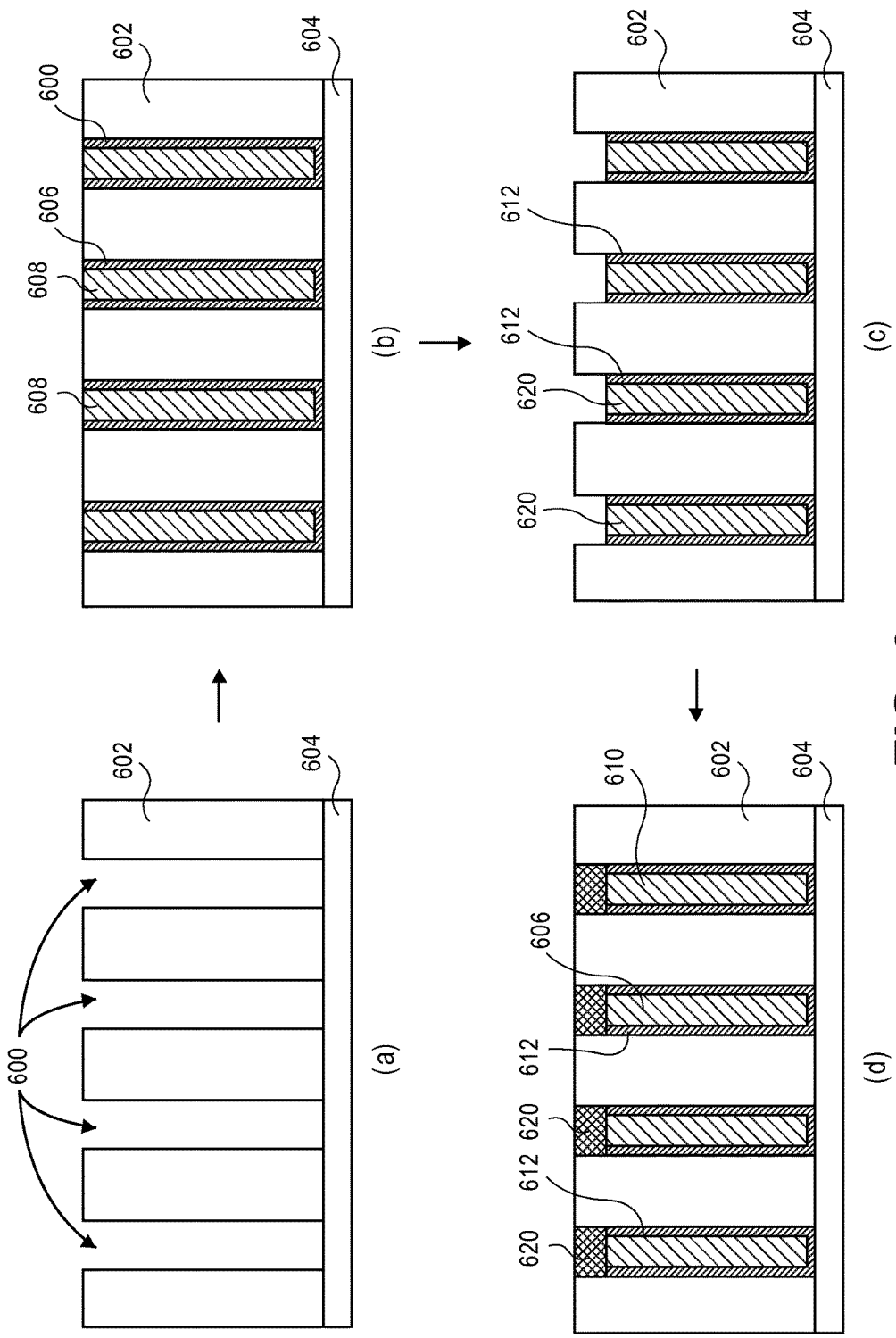
FIG. 6 illustrates various operations in a processing scheme using a transition metal dry etch approach for metal gate processing, in accordance with an embodiment of the present invention.

In a third aspect of the present disclosure, embodiments are directed to recessing of metal gates for, e.g., dielectric cap formation. FIG. 6 illustrates various operations in a processing scheme using a transition metal dry etch approach for metal gate processing, in accordance with an embodiment of the present invention.

Referring to part (a) of FIG. 6, a plurality of gate trenches 600 is formed in an insulating or dielectric layer 602 formed above a substrate 604. Referring to part (b) of FIG. 6, a metal workfunction layer 606 is formed in the plurality of gate trenches 600. A metal fill layer 608 is then formed on the metal workfunction layer 606, as is also depicted in part (b) of FIG. 6. The metal fill layer 608 may include a transition metal species such as Co, Fe, Ni, Pt or Ru. Also, it is to be appreciated that the metal fill layer 608 may be controlled to the level of the field, or the growth may be performed in excess and then planarized back (e.g., by a CMP process) during which metal workfunction layer 606 formed on the field may also be removed.

Referring to part (c) of FIG. 6, partial recess of the metal fill layer 608 is performed to provide recessed fill material layer 610. In an embodiment, the metal fill layer 608 is partially recessed using a transition metal dry etch approach as described in association with FIG. 1. In one such embodiment, the metal fill layer 608 is partially recessed selectively to the metal workfunction layer 606. However, in another embodiment the metal workfunction layer 606 is also etchable using techniques described herein. In that embodiment, the metal workfunction layer 606 is also partially recessed using a transition metal dry etch approach to form recessed metal workfunction layer 612, as is depicted in part (c) of FIG. 6. Referring to part (d) of FIG. 6, a dielectric cap layer 620 is formed on the recessed metal fill layer 610 and on the recessed metal workfunction layer 612. Such a dielectric cap layer 620 may facilitate further processing and/or may be used to inhibit shoring between different conductive features, such as for self-aligned contact formation.

Figure 7A:
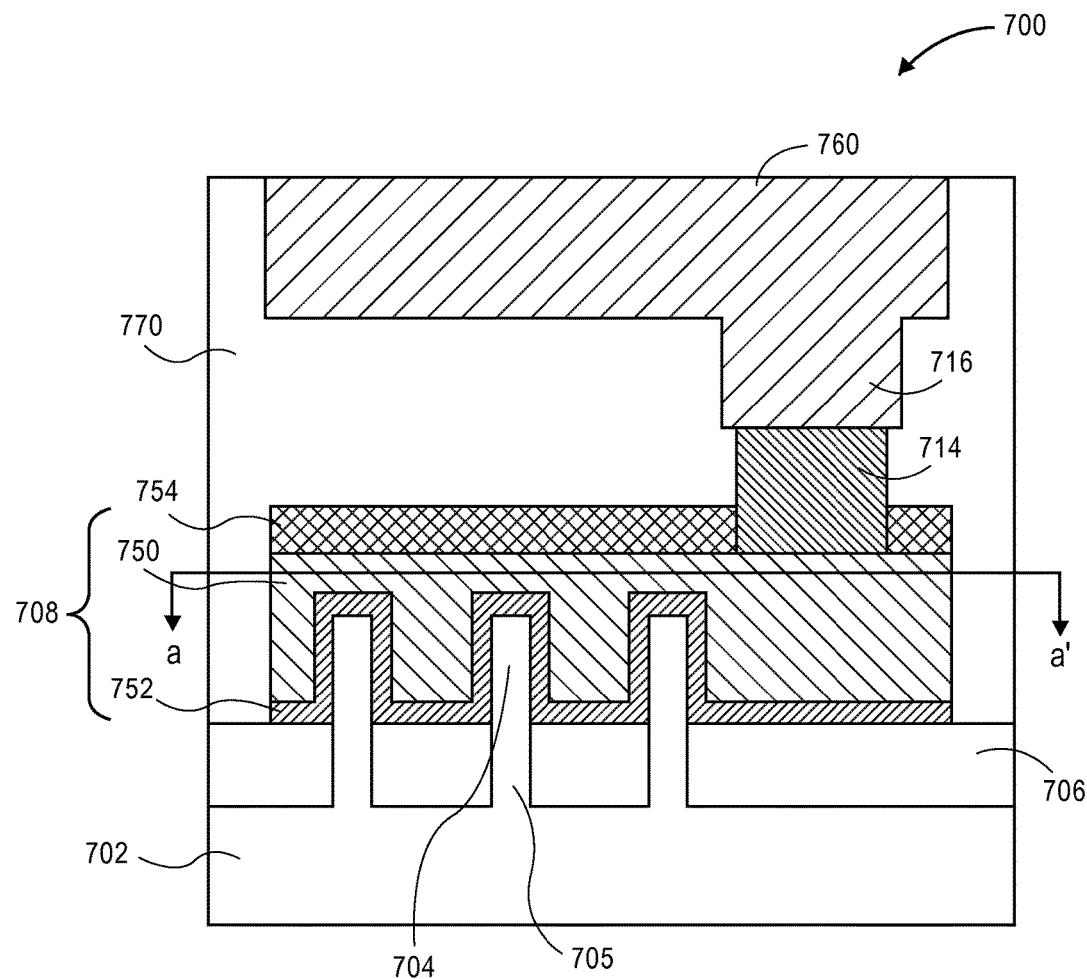
FIG. 7A illustrates a cross-sectional view of a non-planar semiconductor device, in accordance with an embodiment of the present invention.
Figure 7B:
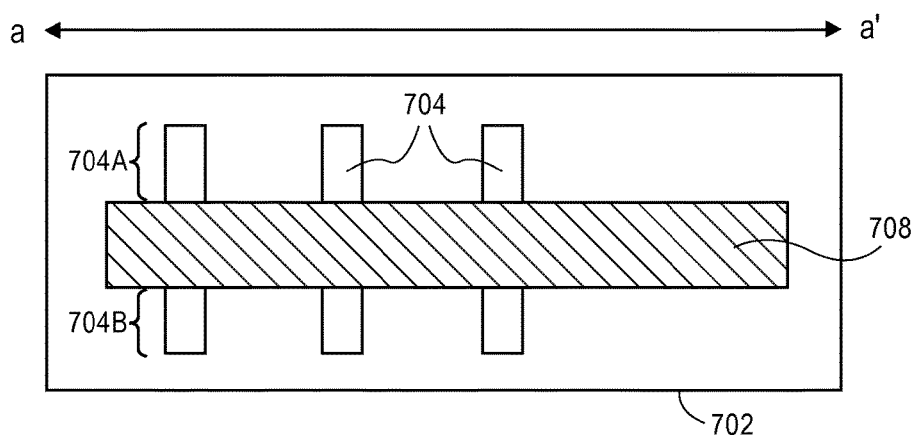
FIG. 7B illustrates a plan view taken along the a-a' axis of the semiconductor device of FIG. 7A, in accordance with an embodiment of the present invention.

One or more embodiments described herein are directed to fabricating semiconductor devices, such as for PMOS and NMOS device fabrication. For example, one or more features of a semiconductor device is formed using a using a transition metal dry etch approach as described in association with FIG. 1. As an example of a completed device, FIGS. 7A and 7B illustrate a cross-sectional view and a plan view (taken along the a-a' axis of the cross-sectional view), respectively, of a non-planar semiconductor device, in accordance with an embodiment of the present invention. As described below, metal gate structures can be recessed by using a transition metal dry etch approach as described in association with FIG. 1. Additionally, other features such as contacts and vias may also be recessed using a transition metal dry etch approach as described in association with FIG. 1.

Referring to FIG. 7A, a semiconductor structure or device 700 includes a non-planar active region (e.g., a fin structure including protruding fin portion 704 and sub-fin region 705) formed from substrate 702, and within isolation region 706. A gate line 708 is disposed over the protruding portions 704 of the non-planar active region as well as over a portion of the isolation region 706. As shown, gate line 708 includes a gate electrode 750 and a gate dielectric layer 752. In one embodiment, gate line 708 may also include a dielectric cap layer 754. A gate contact 714, and overlying gate contact via 716 are also seen from this perspective, along with an gate contact 714, and overlying gate contact via 716, all of which are disposed in inter-layer dielectric stacks or layers 770. Also seen from the perspective of FIG. 7A, the gate contact 714 is, in one embodiment, disposed over isolation region 706, but not over the non-planar active regions. In an embodiment, the pattern of fins is a grating pattern.

In an embodiment, the dielectric cap layer 754 is formed after recessing at least a portion of the gate electrode 750 using a transition metal dry etch approach as described in association with FIG. 1. In additional embodiment, portions of the gate contact 714 or the the overlying gate contact via 716 are recessed according to the example of FIG. 3 during processing using a transition metal dry etch approach as described in association with FIG. 1.

Referring to FIG. 7B, the gate line 708 is shown as disposed over the protruding fin portions 704. Source and drain regions 704A and 704B of the protruding fin portions 704 can be seen from this perspective. In one embodiment, the source and drain regions 704A and 704B are doped portions of original material of the protruding fin portions 704. In another embodiment, the material of the protruding fin portions 704 is removed and replaced with another semiconductor material, e.g., by epitaxial deposition. In either case, the source and drain regions 704A and 704B may extend below the height of dielectric layer 706, i.e., into the sub-fin region 705.

In an embodiment, the semiconductor structure or device 700 is a non-planar device such as, but not limited to, a fin-FET or a tri-gate device. In such an embodiment, a corresponding semiconducting channel region is composed of or is formed in a three-dimensional body. In one such embodiment, the gate electrode stacks of gate lines 708 surround at least a top surface and a pair of sidewalls of the three-dimensional body. The concepts may be extended to gate all around devices such as nanowire based transistors.

Substrate 702 may be composed of a semiconductor material that can withstand a manufacturing process and in which charge can migrate. In an embodiment, substrate 702 is a bulk substrate composed of a crystalline silicon, silicon/germanium or germanium layer doped with a charge carrier, such as but not limited to phosphorus, arsenic, boron or a combination thereof, to form active region 704. In one embodiment, the concentration of silicon atoms in bulk substrate 702 is greater than 97%. In another embodiment, bulk substrate 702 is composed of an epitaxial layer grown atop a distinct crystalline substrate, e.g. a silicon epitaxial layer grown atop a boron-doped bulk silicon mono-crystalline substrate. Bulk substrate 702 may alternatively be composed of a group III-V material. In an embodiment, bulk substrate 702 is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, bulk substrate 702 is composed of a III-V material and the charge-carrier dopant impurity atoms are ones such as, but not limited to, carbon, silicon, germanium, oxygen, sulfur, selenium or tellurium.

Isolation region 706 may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, the isolation region 706 is composed of a dielectric material such as, but not limited to, silicon dioxide, silicon oxy-nitride, silicon nitride, or carbon-doped silicon nitride.

Gate line 708 may be composed of a gate electrode stack which includes a gate dielectric layer 752 and a gate electrode layer 750. In an embodiment, the gate electrode of the gate electrode stack is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the substrate 702. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride.

Spacers associated with the gate electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

Gate contact 714 and overlying gate contact via 716 may be composed of a conductive material. In an embodiment, one or more of the contacts or vias are composed of a metal species. The metal species may be a pure metal, such as tungsten, nickel, or cobalt, or may be an alloy such as a metal-metal alloy or a metal-semiconductor alloy (e.g., such as a silicide material).

In an embodiment (although not shown), providing structure 700 involves formation of a contact pattern which is essentially perfectly aligned to an existing gate pattern while eliminating the use of a lithographic step with exceedingly tight registration budget. In one such embodiment, this approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, the gate stack structure 708 may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure 700. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

Referring again to FIG. 7A, the arrangement of semiconductor structure or device 700 places the gate contact over isolation regions. Such an arrangement may be viewed as inefficient use of layout space. In another embodiment, however, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present invention include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly (gate) grid with separate patterning of contact features.

It is to be appreciated that not all aspects of the processes described above need be practiced to fall within the spirit and scope of embodiments of the present invention. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a trigate device, an independently accessed double gate device, or a FIN-FET. One or more embodiments may be particularly useful for fabricating semiconductor devices at a 10 nanometer (10 nm) or smaller technology node.

It is to be appreciated that both above described aspects of embodiments of the present invention could be applicable to front end or back end processing technologies. Furthermore, embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 8:
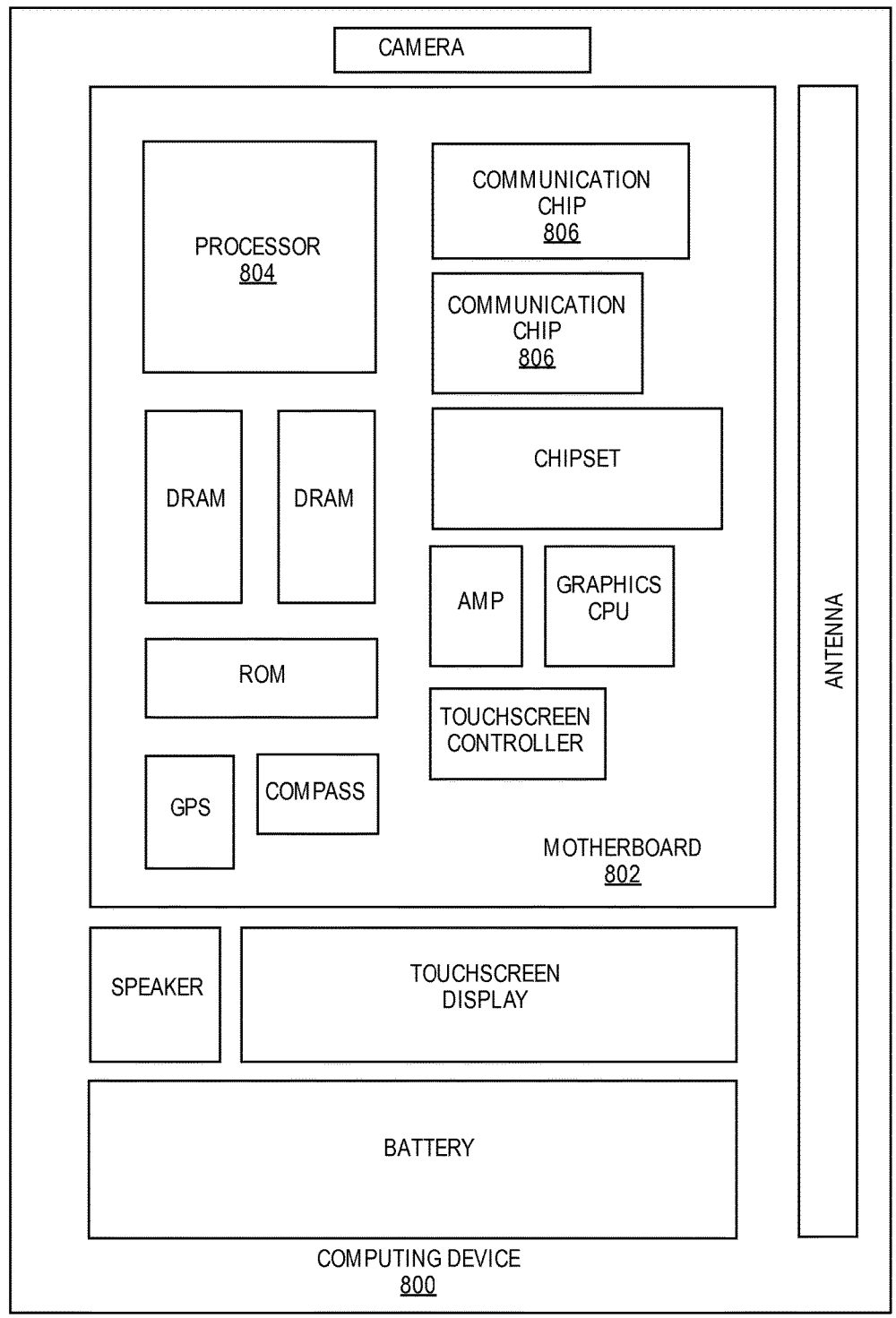
FIG. 8 illustrates a computing device in accordance with one implementation of the invention.

FIG. 8 illustrates a computing device 800 in accordance with one implementation of the invention. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touch-screen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the invention, the integrated circuit die of the processor includes one or more metal features etched using transition metal dry etch by atomic layer removal of oxide layers for device fabrication, as built in accordance with implementations of the invention. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with an embodiment of the present invention, the integrated circuit die of the communication chip includes one or more metal features etched using transition metal dry etch by atomic layer removal of oxide layers for device fabrication, as built in accordance with implementations of the invention.

In further implementations, another component housed within the computing device 800 may contain an integrated circuit die that includes one or more metal features etched using transition metal dry etch by atomic layer removal of oxide layers for device fabrication, as built in accordance with implementations of the invention.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Figure 9:
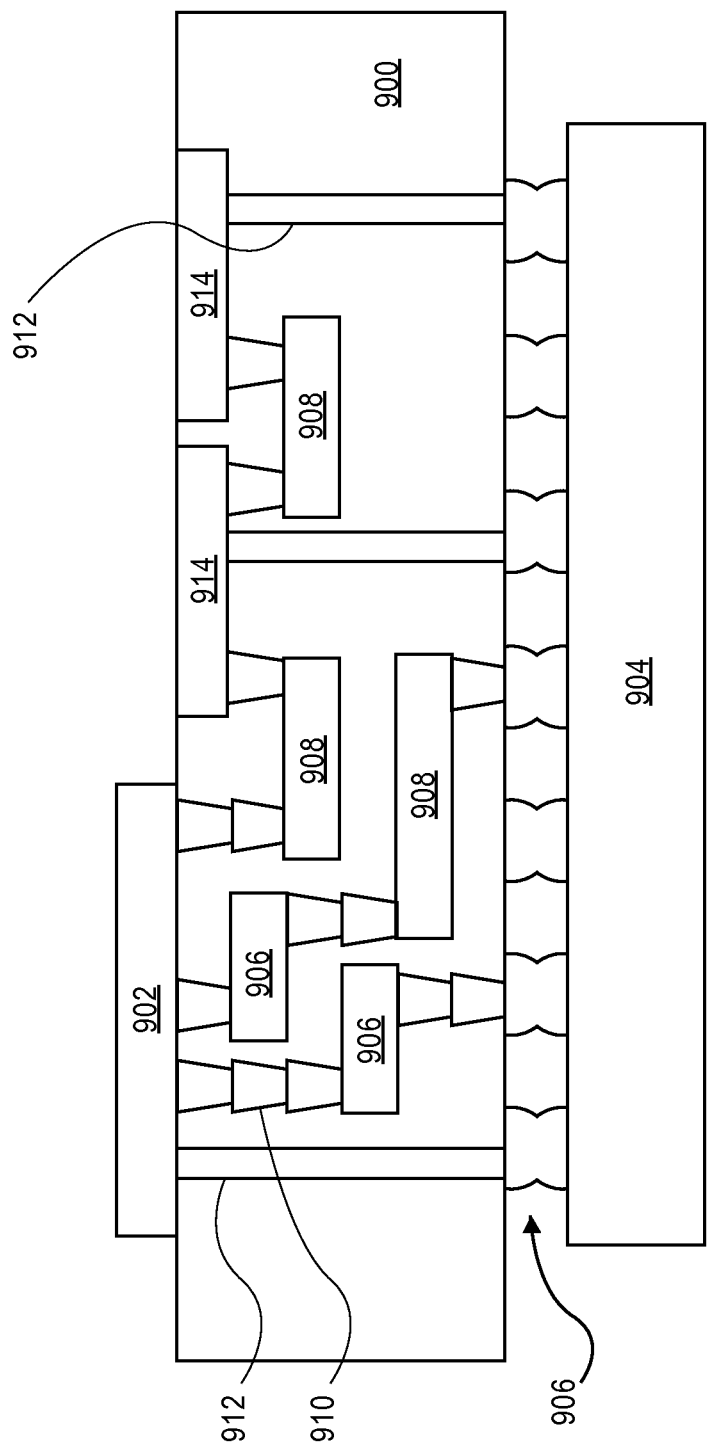
FIG. 9 is an interposer implementing one or more embodiments of the invention.

FIG. 9 illustrates an interposer 900 that includes one or more embodiments of the invention. The interposer 900 is an intervening substrate used to bridge a first substrate 902 to a second substrate 904. The first substrate 902 may be, for instance, an integrated circuit die. The second substrate 904 may be, for instance, a memory module, a computer motherboard, or another integrated circuit die. Generally, the purpose of an interposer 900 is to spread a connection to a wider pitch or to reroute a connection to a different connection. For example, an interposer 900 may couple an integrated circuit die to a ball grid array (BGA) 906 that can subsequently be coupled to the second substrate 904. In some embodiments, the first and second substrates 902/904 are attached to opposing sides of the interposer 900. In other embodiments, the first and second substrates 902/904 are attached to the same side of the interposer 900. And in further embodiments, three or more substrates are interconnected by way of the interposer 900.

The interposer 900 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 908 and vias 910, including but not limited to through-silicon vias (TSVs) 912. The interposer 900 may further include embedded devices 914, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 900. In accordance with embodiments of the invention, apparatuses or processes disclosed herein may be used in the fabrication of interposer 900.

Thus, embodiments of the present invention include transition metal dry etch by atomic layer removal of oxide layers for device fabrication, and the resulting devices.

In an embodiment, a method of etching a film includes reacting a surface layer of a transition metal species of a transition metal-containing film with a molecular oxidant species. The method also includes removing volatile fragments of the reacted molecular oxidant species to provide an oxidized surface layer of the transition metal species. The method also includes reacting the oxidized surface layer of the transition metal species with a molecular etchant. The method also includes removing the reacted oxidized surface layer of the transition metal species and the reacted molecular etchant by volatlilization.

In one embodiment, the method further includes reacting a second surface layer of the transition metal species of the transition metal-containing film with the molecular oxidant species, removing volatile fragments of the reacted molecular oxidant species to provide a second oxidized surface layer of the transition metal species, reacting the second oxidized surface layer of the transition metal species with the molecular etchant, and removing the reacted oxidized surface layer of the transition metal species and the reacted molecular etchant by volatlilization.

In one embodiment, the reacting, removing, reacting and removing is repeated until a target thickness of the transition metal-containing film is etched away.

In one embodiment, reacting the surface layer of the transition metal species of the transition metal-containing film comprises reacting a surface layer of a transition metal species selected from the group consisting of cobalt, iron, nickel, platinum and ruthenium.

In one embodiment, reacting the surface layer of the transition metal species of the transition metal-containing film with the molecular oxidant species comprises transferring oxygen from molecules having a reactive nitrogen based skeleton.

In one embodiment, reacting the oxidized surface layer of the transition metal species with the molecular etchant comprises reacting with hexafluoroacetylacetone.

In one embodiment, removing the reacted oxidized surface layer of the transition metal species and the reacted molecular etchant by volatlilization comprises removing a transition metal complex comprising a transition metal center chelated by two bidentate ligands and removing $H_2O$.

In an embodiment, a method of fabricating a semiconductor structure includes forming a trench in an inter-layer dielectric (ILD) layer. The method also includes forming a transition metal-containing film in the trench. The method also includes recessing the transition metal-containing film within the trench. The recessing includes reacting a surface layer of a transition metal species of the transition metal-containing film with a molecular oxidant species, removing volatile fragments of the reacted molecular oxidant species to provide an oxidized surface layer of the transition metal species, reacting the oxidized surface layer of the transition metal species with a molecular etchant, and removing the reacted oxidized surface layer of the transition metal species and the reacted molecular etchant by volatlilization.

In one embodiment, the method further includes forming a dielectric capping layer on the recessed transition metal-containing film.

In one embodiment, the semiconductor structure is a conductive via or metal line of a back end metallization structure.

In one embodiment, the semiconductor structure is a metal gate electrode.

In one embodiment, the method further includes reacting a second surface layer of the transition metal species of the transition metal-containing film with the molecular oxidant species, removing volatile fragments of the reacted molecular oxidant species to provide a second oxidized surface layer of the transition metal species, reacting the second oxidized surface layer of the transition metal species with the molecular etchant, and removing the reacted oxidized surface layer of the transition metal species and the reacted molecular etchant by volatlilization.

In one embodiment, the reacting, removing, reacting and removing is repeated until a target thickness of the transition metal-containing film is etched away.

In one embodiment, reacting the surface layer of the transition metal species of the transition metal-containing film comprises reacting a surface layer of a transition metal species selected from the group consisting of cobalt, iron, nickel, platinum and ruthenium.

In one embodiment, reacting the surface layer of the transition metal species of the transition metal-containing film with the molecular oxidant species comprises transferring oxygen from molecules having a reactive nitrogen based skeleton.

In one embodiment, reacting the oxidized surface layer of the transition metal species with the molecular etchant comprises reacting with hexafluoroacetylacetone.

In one embodiment, removing the reacted oxidized surface layer of the transition metal species and the reacted molecular etchant by volatlilization comprises removing a transition metal complex comprising a transition metal center chelated by two bidentate ligands and removing $H_2O$.

In an embodiment, a method of etching a film stack includes forming a patterned mask on a transition metal-containing film stack to provide masked regions and exposed regions of the transition metal-containing film stack. The method also includes etching the transition metal-containing film stack by removing the exposed regions of the transition metal-containing film stack. The etching includes reacting a surface layer of a transition metal species of the transition metal-containing film stack with a molecular oxidant species, removing volatile fragments of the reacted molecular oxidant species to provide an oxidized surface layer of the transition metal species, reacting the oxidized surface layer of the transition metal species with a molecular etchant, and removing the reacted oxidized surface layer of the transition metal species and the reacted molecular etchant by volatlilization.

In one embodiment, the method further includes reacting a second surface layer of the transition metal species of the transition metal-containing film stack with the molecular oxidant species, removing volatile fragments of the reacted molecular oxidant species to provide a second oxidized surface layer of the transition metal species, reacting the second oxidized surface layer of the transition metal species with the molecular etchant, and removing the reacted oxidized surface layer of the transition metal species and the reacted molecular etchant by volatlilization.

In one embodiment, the reacting, removing, reacting and removing is repeated until a target thickness of the transition metal-containing film stack is etched away.

In one embodiment, reacting the surface layer of the transition metal species of the transition metal-containing film stack comprises reacting a surface layer of a transition metal species selected from the group consisting of cobalt, iron, nickel, platinum and ruthenium.

In one embodiment, reacting the surface layer of the transition metal species of the transition metal-containing film stack with the molecular oxidant species comprises transferring oxygen from molecules having a reactive nitrogen based skeleton.

In one embodiment, reacting the oxidized surface layer of the transition metal species with the molecular etchant comprises reacting with hexafluoroacetylacetone.

In one embodiment, removing the reacted oxidized surface layer of the transition metal species and the reacted molecular etchant by volatlilization comprises removing a transition metal complex comprising a transition metal center chelated by two bidentate ligands and removing $H_2O$.

What is claimed is:

1. A method of etching a film, the method comprising:
   reacting a surface layer of a transition metal species of a transition metal-containing film with a molecular oxidant species, wherein reacting the surface layer of the transition metal species of the transition metal-containing film with the molecular oxidant species comprises transferring oxygen from molecules having a reactive nitrogen based organic skeleton;
   removing volatile fragments of the reacted molecular oxidant species to provide an oxidized surface layer of the transition metal species;
   reacting the oxidized surface layer of the transition metal species with a molecular etchant; and
   removing the reacted oxidized surface layer of the transition metal species and the reacted molecular etchant by volatlilization.

2. The method of claim 1, further comprising:
   reacting a second surface layer of the transition metal species of the transition metal-containing film with the molecular oxidant species;
   removing volatile fragments of the reacted molecular oxidant species to provide a second oxidized surface layer of the transition metal species;
   reacting the second oxidized surface layer of the transition metal species with the molecular etchant; and
   removing the reacted oxidized surface layer of the transition metal species and the reacted molecular etchant by volatlilization.

3. The method of claim 2, wherein the reacting, removing, reacting and removing is repeated until a target thickness of the transition metal-containing film is etched away.

4. The method of claim 1, wherein reacting the surface layer of the transition metal species of the transition metal-containing film comprises reacting a surface layer of a transition metal species selected from the group consisting of cobalt, iron, nickel, platinum and ruthenium.

5. The method of claim 1, wherein reacting the oxidized surface layer of the transition metal species with the molecular etchant comprises reacting with hexafluoroacetylacetone.

6. The method of claim 1, wherein removing the reacted oxidized surface layer of the transition metal species and the reacted molecular etchant by volatlilization comprises removing a transition metal complex comprising a transition metal center chelated by two bidentate ligands and removing $H_2O$.

7. A method of fabricating a semiconductor structure, the method comprising:
   forming a trench in an inter-layer dielectric (ILD) layer;
   forming a transition metal-containing film in the trench; and
   recessing the transition metal-containing film within the trench, the recessing comprising:
   reacting a surface layer of a transition metal species of the transition metal-containing film with a molecular oxidant species, wherein reacting the surface layer of the transition metal species of the transition metal-containing film with the molecular oxidant species comprises transferring oxygen from molecules having a reactive nitrogen based organic skeleton;

removing volatile fragments of the reacted molecular oxidant species to provide an oxidized surface layer of the transition metal species;

reacting the oxidized surface layer of the transition metal species with a molecular etchant; and removing the reacted oxidized surface layer of the transition metal species and the reacted molecular etchant by volatlilization.

8. The method of claim 7, further comprising:
forming a dielectric capping layer on the recessed transition metal-containing film.

9. The method of claim 7, wherein the semiconductor structure is a conductive via or metal line of a back end metallization structure.

10. The method of claim 7, wherein the semiconductor structure is a metal gate electrode.

11. The method of claim 7, further comprising:
reacting a second surface layer of the transition metal species of the transition metal-containing film with the molecular oxidant species;

removing volatile fragments of the reacted molecular oxidant species to provide a second oxidized surface layer of the transition metal species;

reacting the second oxidized surface layer of the transition metal species with the molecular etchant; and removing the reacted oxidized surface layer of the transition metal species and the reacted molecular etchant by volatlilization.

12. The method of claim 11, wherein the reacting, removing, reacting and removing is repeated until a target thickness of the transition metal-containing film is etched away.

13. The method of claim 7, wherein reacting the surface layer of the transition metal species of the transition metal-containing film comprises reacting a surface layer of a transition metal species selected from the group consisting of cobalt, iron, nickel, platinum and ruthenium.

14. The method of claim 7, wherein reacting the oxidized surface layer of the transition metal species with the molecular etchant comprises reacting with hexafluoroacetylacetone.

15. The method of claim 7, wherein removing the reacted oxidized surface layer of the transition metal species and the reacted molecular etchant by volatlilization comprises removing a transition metal complex comprising a transition metal center chelated by two bidentate ligands and removing $H_2O$.

16. A method of etching a film stack, the method comprising:
forming a patterned mask on a transition metal-containing film stack to provide masked regions and exposed regions of the transition metal-containing film stack; and etching the transition metal-containing film stack by removing the exposed regions of the transition metal-containing film stack, the etching comprising:
reacting a surface layer of a transition metal species of the transition metal-containing film stack with a molecular oxidant species, wherein reacting the surface layer of the transition metal species of the transition metal-containing film stack with the molecular oxidant species comprises transferring oxygen from molecules having a reactive nitrogen based organic skeleton;

removing volatile fragments of the reacted molecular oxidant species to provide an oxidized surface layer of the transition metal species;

reacting the oxidized surface layer of the transition metal species with a molecular etchant; and removing the reacted oxidized surface layer of the transition metal species and the reacted molecular etchant by volatlilization.

17. The method of claim 16, further comprising:
reacting a second surface layer of the transition metal species of the transition metal-containing film stack with the molecular oxidant species;

removing volatile fragments of the reacted molecular oxidant species to provide a second oxidized surface layer of the transition metal species;

reacting the second oxidized surface layer of the transition metal species with the molecular etchant; and removing the reacted oxidized surface layer of the transition metal species and the reacted molecular etchant by volatlilization.

18. The method of claim 17, wherein the reacting, removing, reacting and removing is repeated until a target thickness of the transition metal-containing film stack is etched away.

19. The method of claim 16, wherein reacting the surface layer of the transition metal species of the transition metal-containing film stack comprises reacting a surface layer of a transition metal species selected from the group consisting of cobalt, iron, nickel, platinum and ruthenium.

20. The method of claim 16, wherein reacting the oxidized surface layer of the transition metal species with the molecular etchant comprises reacting with hexafluoroacetylacetone.

21. The method of claim 16, wherein removing the reacted oxidized surface layer of the transition metal species and the reacted molecular etchant by volatlilization comprises removing a transition metal complex comprising a transition metal center chelated by two bidentate ligands and removing $H_2O$.

* * * * *